(12) United States Patent
Le et al.

(10) Patent No.: US 6,377,065 B1
(45) Date of Patent: Apr. 23, 2002

(54) GLITCH DETECTION FOR SEMICONDUCTOR TEST SYSTEM

(75) Inventors: Anthony Le; Rochit Rajsuman; James Alan Turnquist; Shigeru Sugamori, all of Santa Clara, CA (US)

(73) Assignee: Advantest Corp., Tokyo (JP)

( * ) Notice: Subject to any disclaimer, the term of this patent is extended or adjusted under 35 U.S.C. 154(b) by 0 days.

(21) Appl. No.: 09/548,875

(22) Filed: Apr. 13, 2000

(51) Int. Cl.[7] ............................................... G01R 31/26
(52) U.S. Cl. ..................... 324/765; 324/158.1; 714/724
(58) Field of Search ............................. 324/158.1, 765, 324/754; 714/724, 735–745

(56) References Cited

U.S. PATENT DOCUMENTS

| | | |
|---|---|---|
| 4,495,621 A | 1/1985 | Nakagomi et al. |
| 5,210,538 A | 5/1993 | Kuroiwa |
| 5,381,421 A * | 1/1995 | Dickol et al. ................. 371/27 |
| 5,498,985 A | 3/1996 | Parll et al. |
| 6,226,765 B1 * | 5/2001 | Le et al. ...................... 714/718 |

* cited by examiner

*Primary Examiner*—Safet Metjahic
*Assistant Examiner*—Jimmy Nguyen
(74) *Attorney, Agent, or Firm*—Muramatsu & Associates

(57) ABSTRACT

A semiconductor test system has a glitch detection function for detecting glitches in an output signal from a device under test to accurately evaluate the device under test (DUT). The semiconductor test system includes an event memory for storing event data, an event generator for producing test patterns, strobe signals and expected patterns based on the event data from the event memory, a pin electronics for transmitting the test pattern from the event generator to the DUT and receiving an output signal of the DUT and sampling the output signal by timings of the strobe signals, a pattern comparator for comparing sampled output data with the expected patterns, and a glitch detection unit for receiving the output signal from the DUT and detecting a glitch in the output signal by counting a number of edges in the output signal and comparing an expected number of edges.

12 Claims, 11 Drawing Sheets

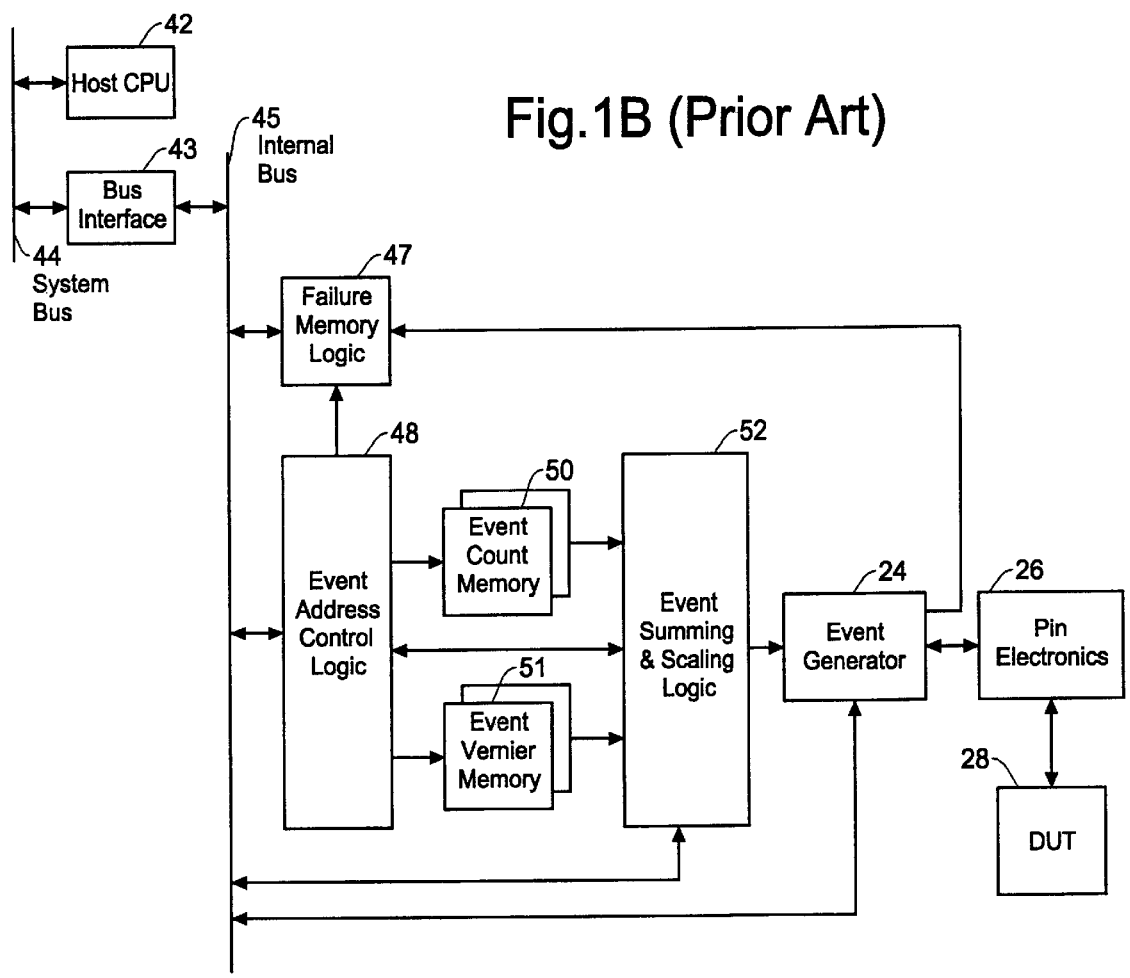

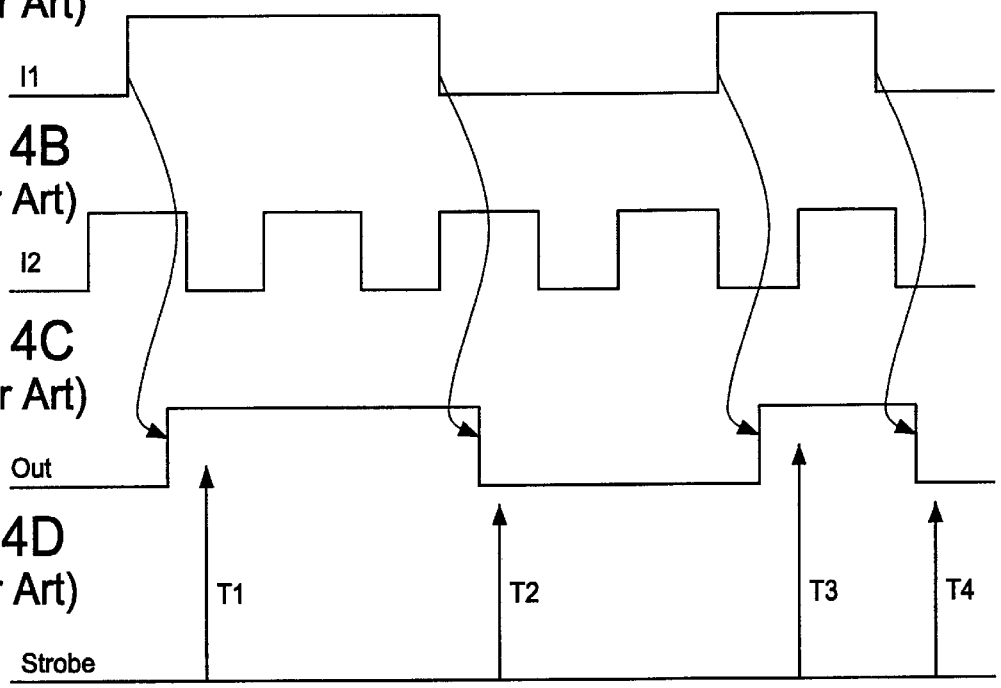
Fig. 4A (Prior Art) I1
Fig. 4B (Prior Art) I2
Fig. 4C (Prior Art) Out
Fig. 4D (Prior Art) Strobe — T1, T2, T3, T4

Fig. 5A (Prior Art)
Fig. 5B (Prior Art)
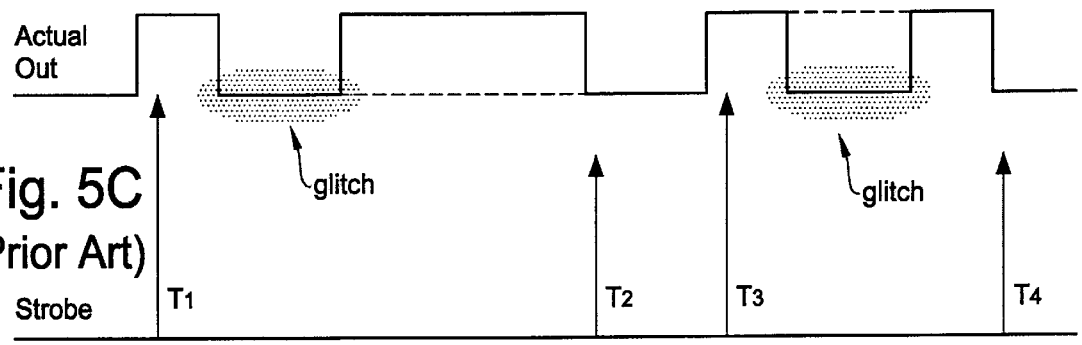
Fig. 5C (Prior Art)

Fig. 10A
Simulated Out
Fig. 10B
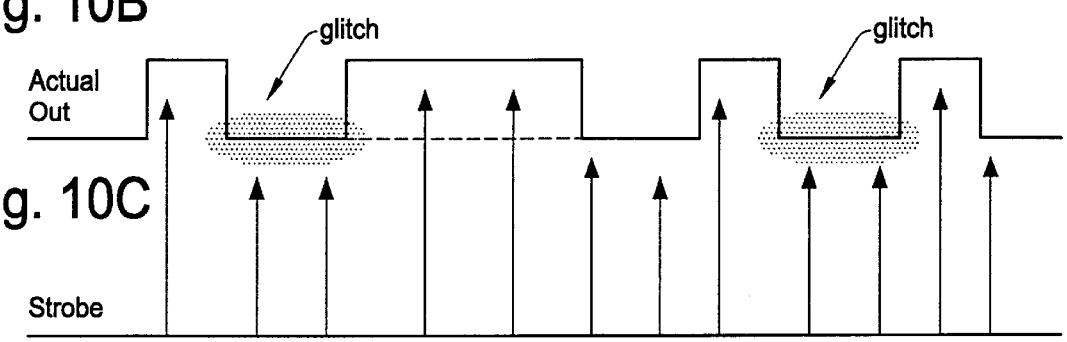
Actual Out
Fig. 10C
Strobe

GLITCH DETECTION FOR SEMICONDUCTOR TEST SYSTEM

FIELD OF THE INVENTION

This invention relates to a semiconductor test system for testing semiconductor devices, and more particularly, to a semiconductor test system having a glitch detection means for detecting glitches in an output signal of a semiconductor device under test to accurately evaluate the performance of the device under test.

BACKGROUND OF THE INVENTION

In testing semiconductor devices such as ICs and LSIs by a semiconductor test system, such as an IC tester, a semiconductor IC device to be tested is provided with test signals or test patterns produced by an IC tester at its appropriate pins at predetermined test timings. The IC tester receives output signals from the IC device under test in response to the test signals. The output signals are strobed or sampled by strobe signals with predetermined timings to be compared with expected data to determine whether the IC device functions correctly.

Traditionally, timings of the test signals and strobe signals are defined relative to a tester rate or a tester cycle of the semiconductor test system. Such a test system is sometimes called a cycle based test system. Another type of test system is called an event based test system wherein the desired test signals and strobe signals are produced by event data from an event memory directly on a per pin basis. The present invention is applicable to both cycle based test system and the event based test system.

An example of configuration of a traditional cycle based test system is shown in a block diagram of FIG. 1A. In this example, a test processor 11 is a dedicated processor provided within the semiconductor test system for controlling the operation of the test system through a tester bus. Based on pattern data from the test processor 11, a pattern generator 12 provides timing data and waveform data to a timing generator 13 and a wave formatter 14, respectively. A test pattern is produced by the wave formatter 14 with use of the waveform data from the pattern generator 12 and the timing data from the timing generator 13. The test pattern is supplied to a device under test (DUT) 19 through a driver 15 in a pin electronics 20.

A response signal from the DUT 19 resulted from the test pattern is converted to a logic signal by an analog comparator 16 in the pin electronics 20 with reference to a predetermined threshold voltage level. The logic signal is compared with expected value data from the pattern generator 12 by a logic comparator 17. The result of the logic comparison is stored in a failure memory 18 corresponding to the address of the DUT 19. As noted above, the driver 15, the analog comparator 16 as well as switches (not shown) for changing pins of the device under test, are provided in the pin electronics 20.

An example of configuration of an event based test system is shown in a block diagram of FIG. 1B. In an event based test system, notion of events is employed where events are any changes of the logic state in signals to be used for testing a semiconductor device under test. For example, such changes are rising and falling edges of test signals or timing edges of strobe signals. The timings of the events are defined with respect to a time difference from a reference time point. Typically, such a reference time point is a timing of the previous event. Alternatively, such a reference time point is a fixed start time common to all of the events.

In an event based test system, since the timing data in a timing memory (event memory) does not need to include complicated information regarding waveform, vector, delay and etc. at each and every test cycle, the description of the timing data can be dramatically simplified. In the event based test system, as noted above, typically, the timing (event) data for each event stored in an event memory is expressed by a time difference between the current event and the last event. Since such a time difference between the adjacent events (delta time) is small, unlike a time difference from a fixed start point (absolute time), a size of the data in the memory can also be small, resulting in the reduction of the memory capacity.

In the example of FIG. 1B, the event based test system includes a host computer 42 and a bus interface 43 both are connected to a system bus 44, an internal bus 45, an address control logic 48, a failure memory 47, an event memory consists of an event count memory 50 and an event vernier memory 51, an event summing and scaling logic 52, an event generator 24, and a pin electronics 26. The event based test system evaluates a semiconductor device under test (DUT) 28 connected to the pin electronics 26.

An example of the host computer 42 is a work station having a UNIX, Window NT or Linux operating system therein. The host computer 42 functions as a user interface to enable a user to instruct the start and stop operation of the test, to load a test program and other test conditions, or to perform test result analysis in the host computer. The host computer 42 interfaces with a hardware test system through the system bus 44 and the bus interface 43. Although not shown, the host computer 42 is preferably connected to a communication network to send or receive test information from other test systems or computer networks.

The internal bus 45 is a bus in the hardware test system and is commonly connected to most of the functional blocks such as the address control logic 48, failure memory 47, event summing and scaling logic 52, and event generator 24. An example of address control logic 48 is a tester processor which is exclusive to the hardware test system and is not accessible by a user. The address control logic 48 provides instructions to other functional blocks in the test system based on the test program and conditions from the host computer 42. The failure memory 47 stores test results, such as failure information of the DUT 28, in the addresses defined by the address control logic 48. The information stored in the failure memory 47 is used in the failure analysis stage of the device under test.

The address control logic 48 provides address data to the event count memory 50 and the event vernier memory 51 as shown in FIG. 1B. In an actual test system, a plurality of sets of event count memory and event vernier memory will be provided, each set of which corresponds to a test pin of the test system. The event count and vernier memories store the timing data for each event of the test signals and strobe signals. The event count memory 50 stores the timing data which is an integer multiple of the reference clock (integral part), and the event vernier memory 51 stores timing data which is a fraction of the reference clock (fractional part). In the preferred embodiment of the present invention, the timing data for each event is expressed by a time difference (delay time or delta time) from the previous event.

The event summing and scaling logic 52 is to produce data showing overall timing of each event based on the delta timing data from the event count memory 50 and event vernier memory 51. Basically, such overall timing data is produced by summing the integer multiple data and the fractional data. During the process of summing the timing data, a carry over operation of the fractional data (offset to the integer data) is also conducted in the event summing and scaling logic 52. Further during the process of producing the overall timing, timing data may be modified by a scaling factor so that the overall timing be modified accordingly.

The event generator 24 is to actually generate the events based on the overall timing data from the event summing and scaling logic 52. The events (test signals and strobe signals) thus generated are provided to the DUT 28 through the pin electronics 26. Basically, the pin electronics 26 is formed of a large number of components, each of which includes a driver and a comparator as well as switches to establish input and output relationships with respect to the DUT 28.

FIG. 2 is a block diagram showing a more detailed structure in the pin electronics 26 having a driver 35 and an analog comparator 36. The circuit configuration and operation of the pin electronics 20 in the cycle based test system of FIG. 1A is the same as this one. The event generator 24 produces drive events which are provided to an input pin of the DUT 28 as a test signal (test pattern) through the driver 35. The event generator 24 further produces a sampling event which is provided to the analog comparator 36 as a strobe signal for sampling an output signal of the DUT 28. The output signal of the analog comparator 36 is compared with the expected data from the event generator 24 by a pattern comparator 38. If there is a mismatch between the two, a failure signal is sent to the failure memory 47 in FIG. 1B.

FIG. 3A shows an example of circuit diagram of a semiconductor device to be tested, and FIGS. 3B–3D show waveforms involved in the circuit diagram of FIG. 3A. When a signal of FIG. 3B is provided to an input I1 and a clock of FIG. 3C is provided to an input I2, the device of FIG. 3A produces an output signal of FIG. 3D. As noted above with reference to FIG. 2, the output signal of FIG. 3D is sampled at strobe points to see whether it matches the expected output signal.

This situation is shown in FIGS. 4A–4D. The input, clock and output signals of the device under test are shown in FIGS. 4A–4C, respectively. The output signal of FIG. 4C is sampled by strobe signals of FIG. 4D at the timings shown by arrows therein. If the output signal matches the expected (simulated) output signal at all strobe points, the device under test is considered satisfactory and pass the current test pattern. In an actual device test, strobe timings are usually set to points immediately after the transition of the simulated output signal as in the example of FIG. 4D.

FIGS. 5A–5C show the situation where a faulty device produces a different output signal when receiving the same test pattern in the foregoing examples. FIG. 5A shows a simulated (expected) output signal while FIG. 5B shows an actual output signal from the device under test. The output signal of FIG. 5B is faulty because it includes glitches at shaded portions in the waveform. However, by the strobe timings of FIG. 5C, the test produces a pass result since all test points are correct. The faulty is not discovered unless a manufacturer modify the test program to detect the glitches in the output signal or until it is applied to a customer application. This process is costly to both the device manufacturer and the customer.

SUMMARY OF THE INVENTION

Therefore, it is an object of the present invention to provide a semiconductor test system having a glitch detection means for detecting a glitch in an output signal of a semiconductor device under test to accurately evaluate the output signal of the semiconductor device under test.

It is another object of the present invention to provide a semiconductor test system having a glitch detection unit which includes an edge counter for counting the number of edges in the output signal from the semiconductor device under test to compare a correct number of edges, thereby detecting a glitch in the output signal.

It is a further object of the present invention to provide a semiconductor test system having a glitch detection means for detecting a glitch in the output signal from the semiconductor device under test by using a large number of strobes within a cycle of the output signal.

It is a further object of the present invention to provide a semiconductor test system having a glitch detection means for detecting a glitch in the output signal from the semiconductor device under test by using a continuous strobe signal which continuously changes a phase (timing) within a cycle of the output signal.

The present invention is a semiconductor test system having a glitch detection means for detecting glitches in the output signal from the device under test to accurately evaluate the function and signal quality of the device under test. The glitch detection means includes an edge counter which counts the number of edges of the output signal which is compared with the number of edges in the expected output signal. If the number of edges is greater than that of the expected output signal, then it is determined that the output signal from the device under test contains a glitch therein. In another aspect, the glitch detection means includes means for generating a large number of strobes within a cycle of the output signal of the device under test or generating a continuous strobe whose timing (phase) continuously changes within a cycle of the output signal.

In the present invention, the semiconductor test system for testing a semiconductor device includes an event memory for storing event data of events which are any changes in intended signals to be generated for testing a semiconductor device under test (DUT), an event generator for producing the intended signals which are test patterns, strobe signals and expected patterns based on the event data from the event memory, a pin electronics provided between the event generator and the DUT for transmitting the test pattern from the event generator to the DUT and receiving an output signal of the DUT and sampling the output signal by timings of the strobe signals from the event generator, a pattern comparator for comparing sampled output data from the pin electronics with the expected patterns and producing a failure signal when there is a mismatch therebetween, and a glitch detection unit for receiving the output signal from the DUT and detecting a glitch in the output signal by counting a number of edges in the output signal and comparing the count number with an expected number of edges.

In another aspect of the present invention, the glitch in the output signal of the device under test is detected by using a large number of strobe signals within a cycle of the output signal. In a further aspect, the glitch in the output signal of the device under test is detected by using a continuous strobe whose timing (phase) continuously changes within a cycle of the output signal.

According to the present invention, the semiconductor test system has the glitch detection unit for effectively detecting glitches in the output signal from the device under test to accurately evaluate the device under test. The glitch detection unit in the first embodiment allows the test system to detect unexpected output transitions in the device under test while adding only a small amount of extra hardware to the test system. The glitch detection unit also enhances failure detection accuracy without requiring extensive test pattern generation or increasing a device test time. In the second embodiment, glitches can be accurately detected by either the multiple-strobe signals or the continuous strobe signals of the present invention. The second embodiment of the present invention is effective in detecting glitches in the output signal of the device under test without adding any hardware to the test system.

BRIEF DESCRIPTION OF THE DRAWINGS

FIG. 1B is a schematic block diagram showing a basic structure of a cycle based test system, wherein the present invention can be applicable to both types of test system.

FIGS. 4A–4C are timing charts showing waveforms of input and output signals of the device under test of FIG. 3A, FIG. 4D is a timing chart showing an example of timings of strobe signals for sampling the output signal of the device under test shown in FIG. 4C.

FIGS. 5A–5C are timing charts showing a relationship among an expected output signal, an actual output signal of the device under test having a glitch therein, and an example of timings of the strobe signals.

FIGS. 10A–10C are timing charts showing a relationship among an expected output signal, an actual output signal of the device under test having a glitch therein, and timings of the multiple strobe signals in the present invention.

DETAILED DESCRIPTION OF THE PREFERRED EMBODIMENT

The present invention is a semiconductor test system having a glitch detection means for detecting glitches in the output from the device under test to accurately evaluate the function and signal quality of the device under test. In the first aspect, the glitch detection means is a glitch detection unit (circuit) having an edge counter for counting the number of edges of the output signal which is compared with the number of edges in the expected output signal. If the number of edges is greater than the expected output signal, then it is determined that the output signal from the device under test contains a glitch therein. In another aspect, the glitch detection means includes means for generating a large number of strobes within a cycle of the output signal of the device under test or generating a continuous strobe whose timing (phase) continuously changes within a cycle of the output signal.

Figure 6A:
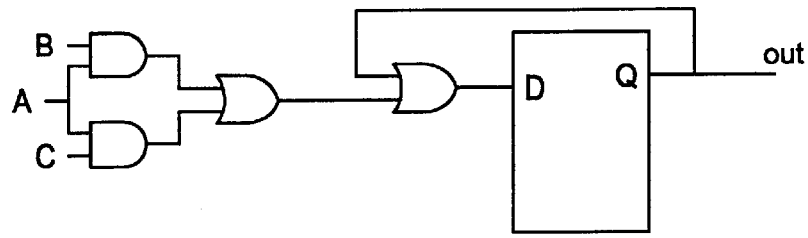
FIG. 6A is a circuit diagram showing an example of semiconductor circuit under test.
Figure 6B:
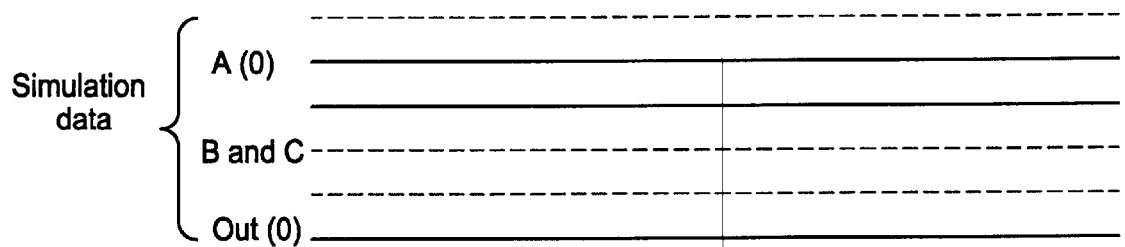
FIGS. 6B and 6C are timing charts showing waveforms of input and output signals of the device under test of FIG. 6A.
Figure 6C:
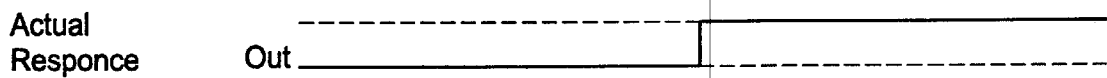
Figure 6D:
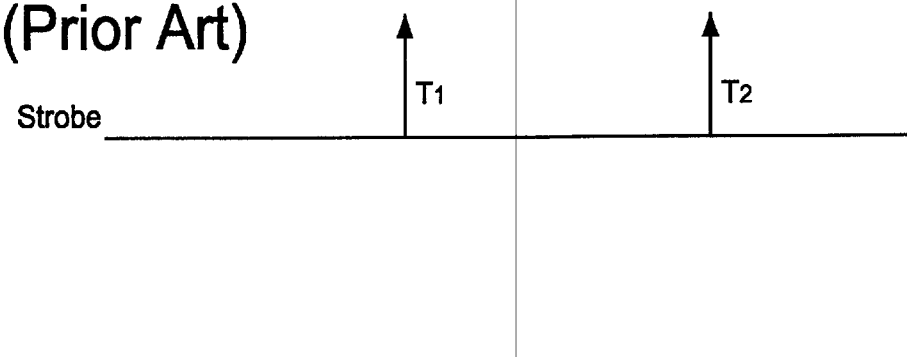
FIG. 6D is a timing chart showing the timings of strobe signals.

Assuming a situation where a circuit diagram such as shown in FIG. 6A is tested by a semiconductor test system by applying input test signals of FIG. 6B. As also shown in FIG. 6B, the expected (simulated) output signal in this case is "0". In this example, an actual output signal of the device under test is correct by showing "0" as shown in the left of FIG. 6C. However, in the case where the output signal of the circuit diagram under test changes to a high level "1" without changes in the input signals as shown in the right of FIG. 6C, this device is faulty. The strobe point T1 in FIG. 6D cannot detect this abnormal change, i.e., a glitch, in the output signal while strobe point T2 is able to detect this error in the output signal.

Figure 7:
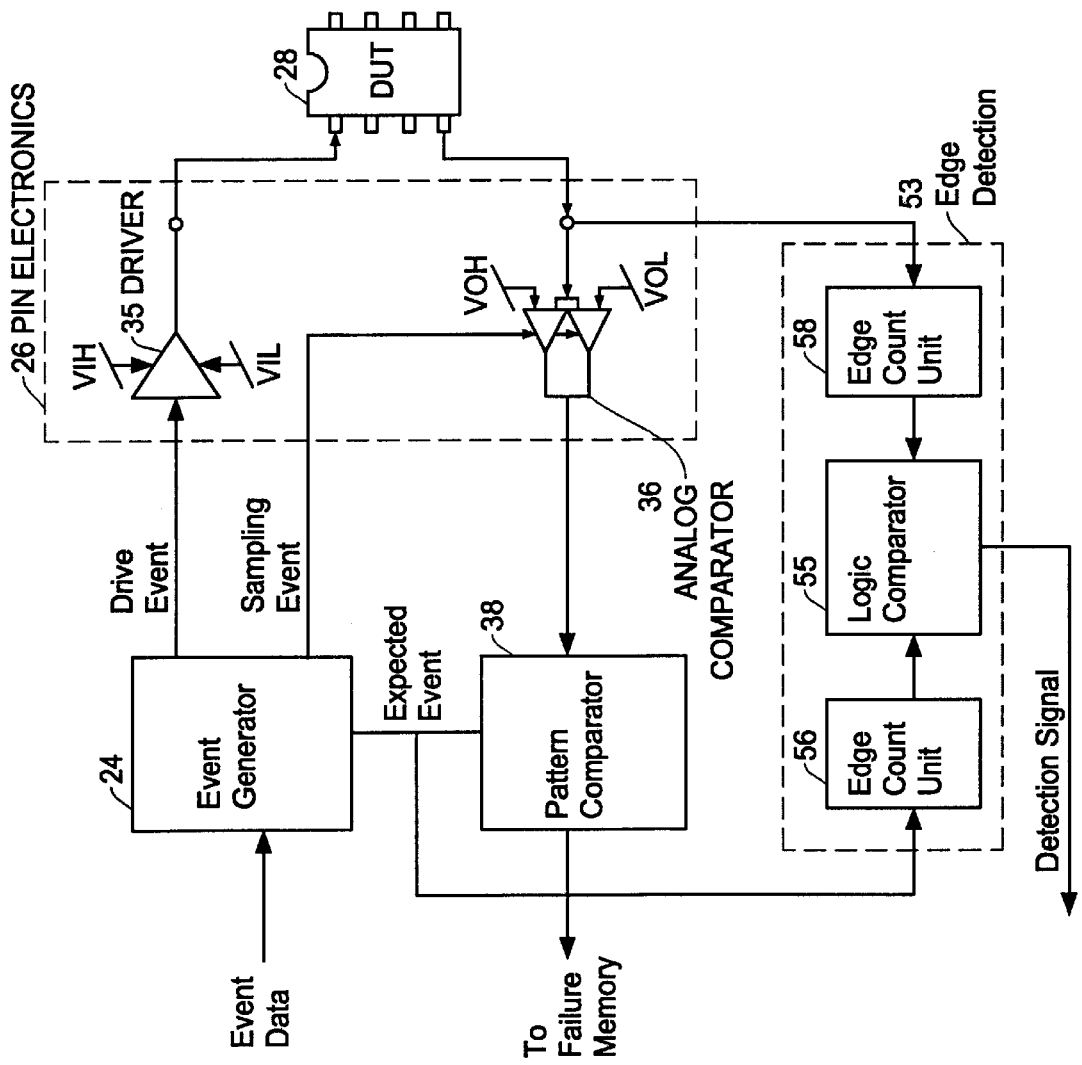
FIG. 7 is a block diagram showing an example of configuration of a glitch detection unit of the present invention to be used a semiconductor test system.

In the first aspect of the present invention, a glitch detection unit (circuit) is incorporated in the semiconductor test system. An example of configuration of a glitch detection unit to be used in the semiconductor test system is shown in FIG. 7. In this example, a glitch detection unit 53 is connected between the pin electronics 26 to receive an output signal of the device under test and the event generator 24 to receive the expected (simulated) output signal. When a glitch is detected in the output signal of the device under test, the glitch detection unit 53 generates a detection signal.

The glitch detection unit 53 includes a logic comparator 55, an edge count unit 56 and an edge count unit 58. The edge count unit 58 counts the number of edges in the output signal from the device under test. The edge count unit 56 counts the number of edges in the expected (simulated) output signal from the event generator (pattern generator) 24. The numbers of edges counted by the edge count units 58 and 56 are compared by the logic comparator 55. If the number of edges counted by the edge count unit 58 is greater than that of the edge count unit 56, it means there is a glitch in the output signal of the device under test. Thus, the logic comparator 55 produces a glitch detection signal which is provided to, for example, the host computer of the test system. In the arrangement of FIG. 7, in the case where the test system can directly produce the number of edges associated with the expected output signal, the edge count unit 56 is unnecessary.

Figure 8:
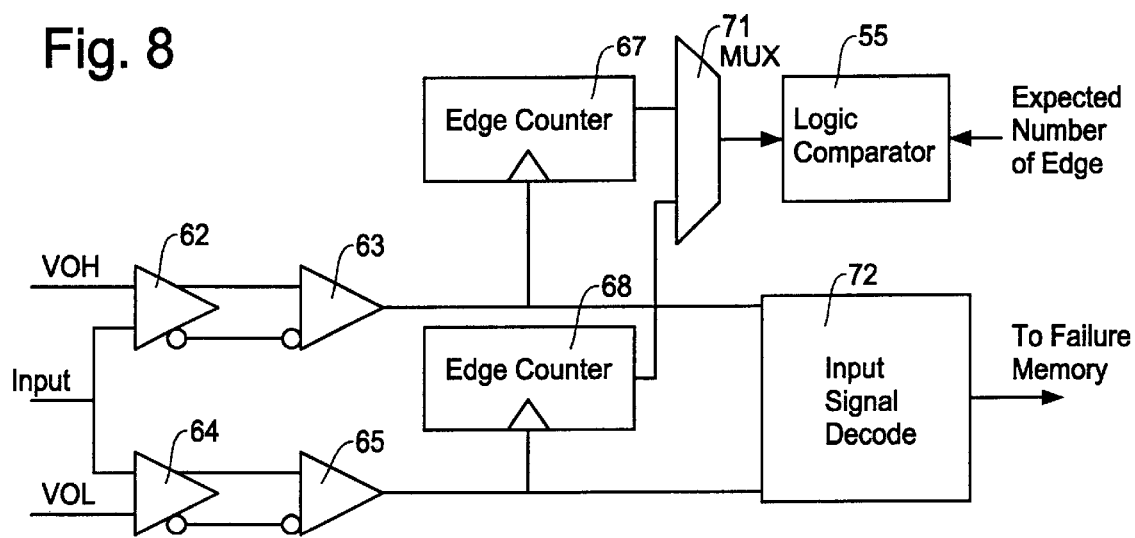
FIG. 8 is a block diagram showing an example of more detailed circuit configuration in the glitch detection unit of the present invention.

An example of more detailed circuit configuration in the glitch detection unit 53 is shown in FIG. 8 which is basically the combination of the edge count unit 58 of FIG. 7 and the logic comparator 55. The edge count unit 58 includes an analog comparators 62 and 64, buffers 63 and 65, edge counters 67 and 68, a multiplexer 71, and an input signal decoder 72. The edge count unit 58 counts the number of edges of an input signal (output signal of the device under test). Although not shown here, the edge count unit 56 of FIG. 7 for counting the number of edges of the expected signal may be included in here depending on the arrangement of the test system as noted above. The edge count unit 56 has the same structure as that of the edge count unit 58.

The analog comparator 62 is configured, for example as a Schmitt trigger circuit, and is provided with a threshold voltage $V_{OH}$ to determine logic "1" in an input signal (output signal of the device under test). The output of the analog comparator 62 is provided to the edge counter 67. Similarly, the analog comparator 64 is configured, for example as a Schmitt trigger circuit, and is provided with a threshold voltage $V_{OI}$ to determine logic "0" in the input signal. The output of the analog comparator 64 is provided to the edge counter 68.

Figure 1A:
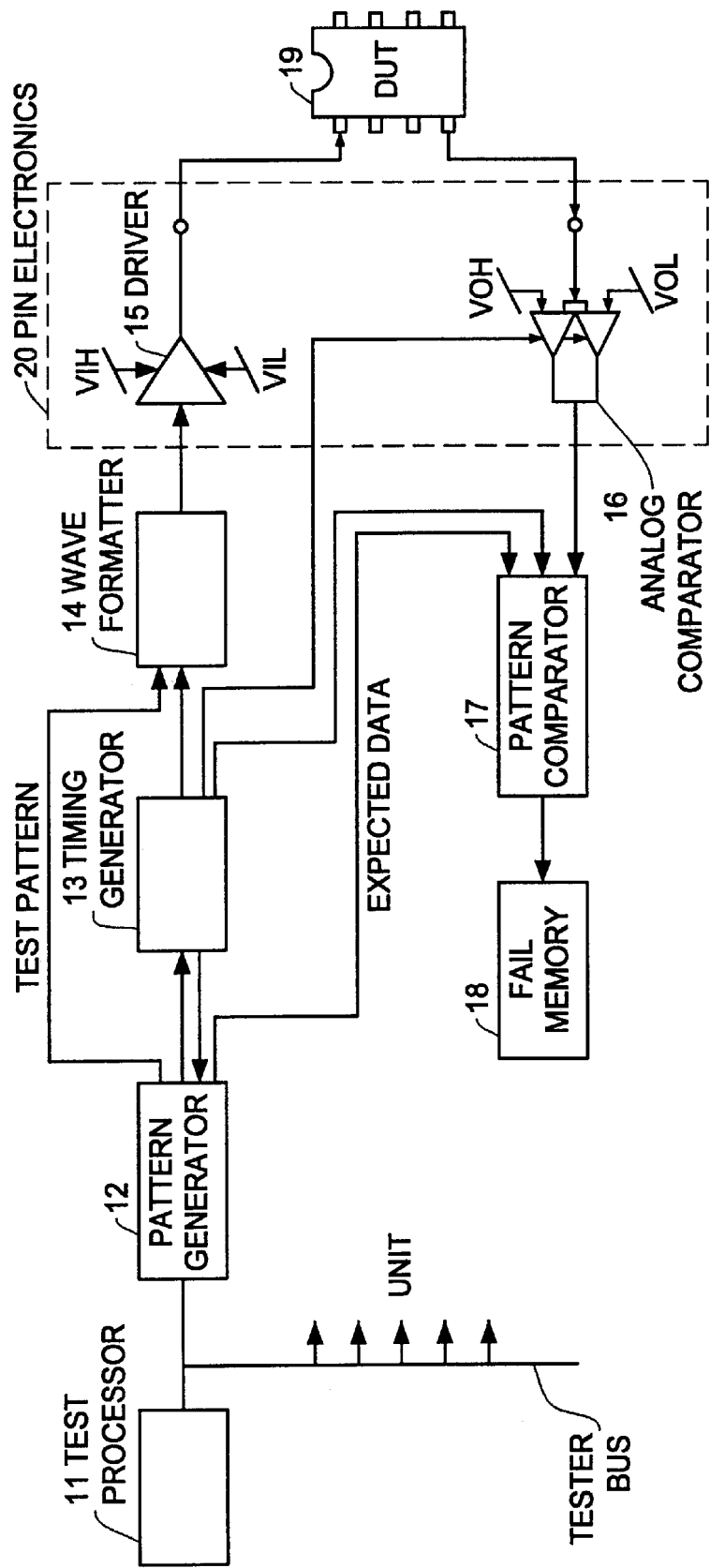
FIG. 1A is a schematic block diagram showing a basic structure of an event based test system.
Figure 2:
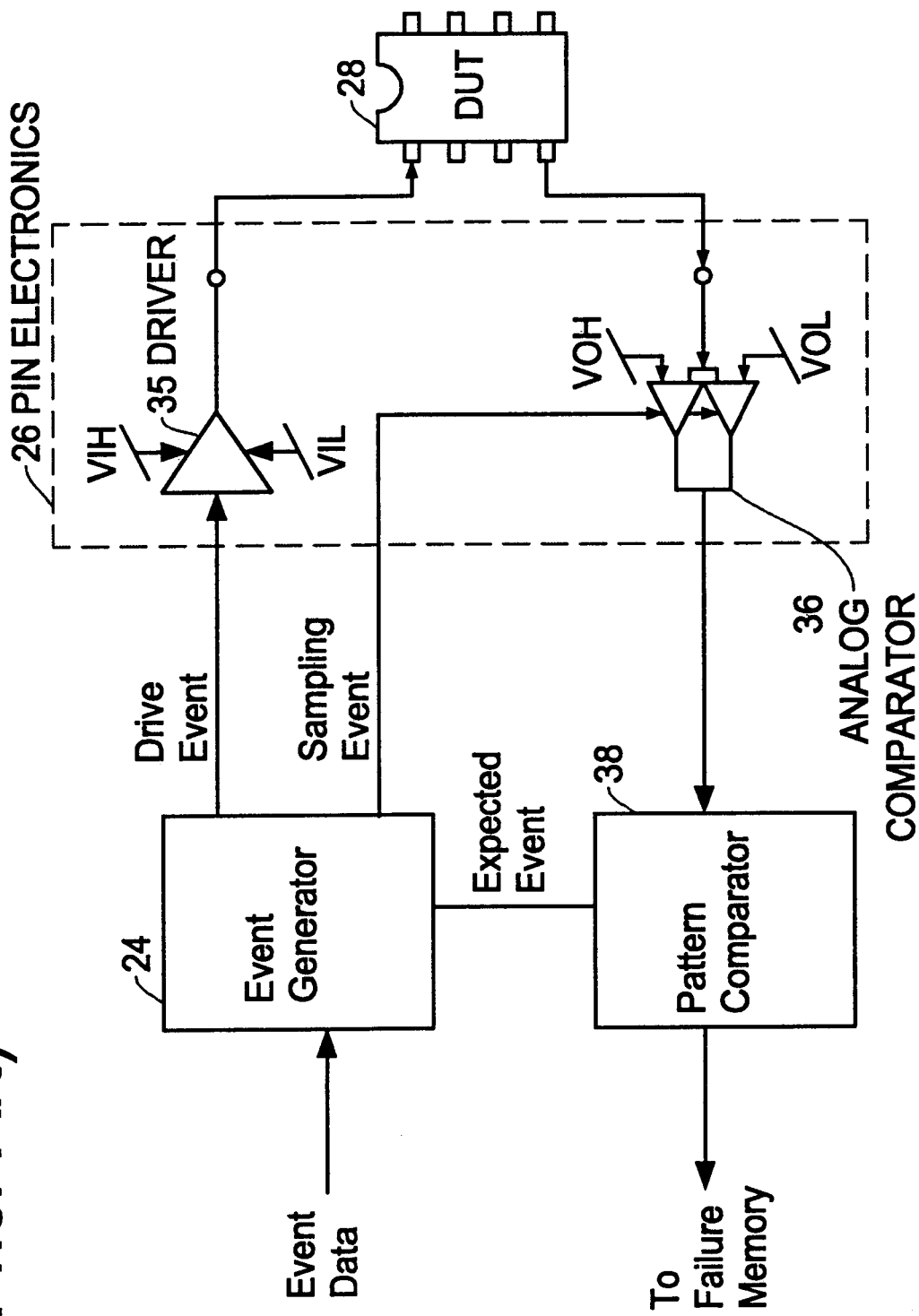
FIG. 2 is a block diagram showing a more detailed structure concerning the pin electronics of FIGS. 1A and 1B and associated drive events (test pattern) and sampling event (strobe signal) for testing a semiconductor device.
Figure 3A:
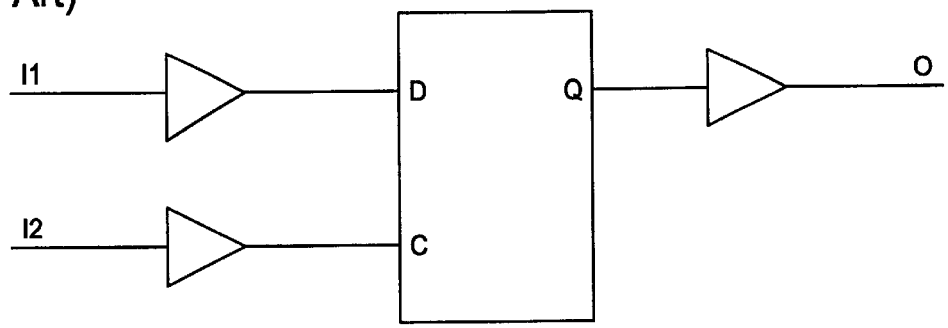
FIG. 3A is a circuit diagram showing an example of semiconductor circuit under test.
Figure 3B:
FIGS. 3B–3D are timing charts showing waveforms of input and output signals of the device under test of FIG. 3A.
Figure 3C:
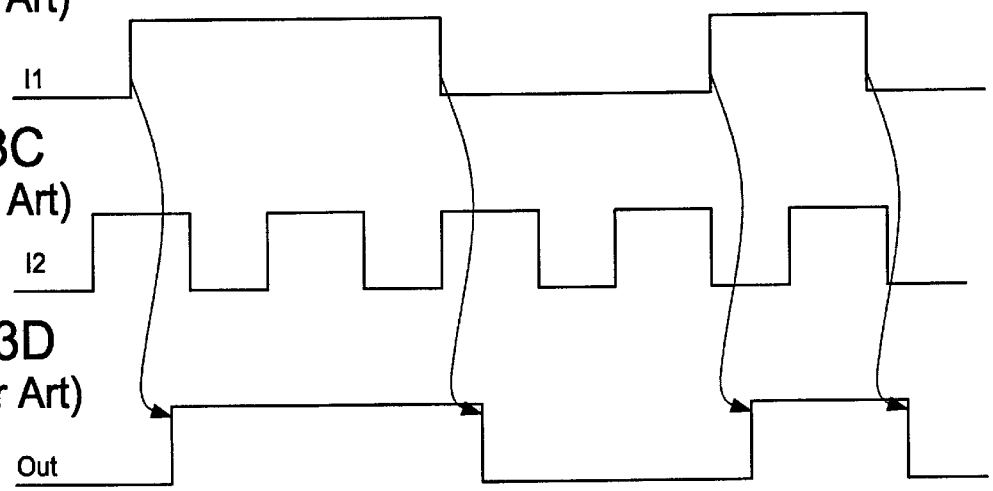
Figure 3D:

Thus, the edge counter 67 counts the number of rising edges in the input signal and the edge counter 68 counts the number of falling edges in the input signal. The multiplexer 71 selects the count data in one of the edge counter 67 or 68 and provides the selected count data to the logic comparator 55 to be compared with the expected number of edges. The input signal decoder 72 is to determine whether the value of the input signal is "0", "1" or "Z". This information is sent to the failure memory such as shown in FIGS. 1 and 2 when the logic comparator 55 indicates that the output signal of the DUT includes a glitch. The data in the failure memory is used in a failure analysis stage after the test.

Figure 9:
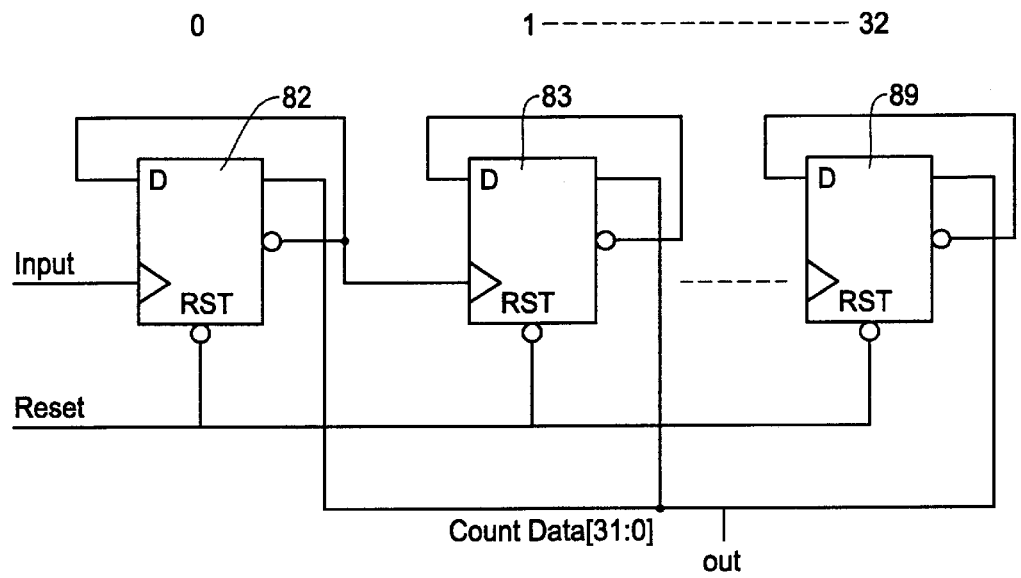
FIG. 9 is a circuit diagram showing an example of configuration in an edge counter in the glitch detection unit of FIG. 8 in accordance with the present invention.

FIG. 9 shows an example of configuration of the edge counter 67 or 68 in FIG. 8. In this example, the edge counter is implemented using a ripple counter architecture. This architecture allows a counter to detect high frequency glitches with a minimum logic area implementation. Other benefit of using a ripple counter is low loading on the input signal (device output signal). The example of FIG. 9 is a 32-bit ripple counter where 32 edge triggered flip-flops or toggle flip-flops are connected in series. All outputs of the flip-flops are wired-OR connected with each other.

Referring back to the example of FIG. 5, the glitch detection unit 53 of the present invention achieves its objective as follows. For a known good device, the number of rising edges on the device output signal is two. After executing the test pattern, the test system reads the counted data in the edge counter 67 and compare the results with the expected data. In this example, the count in the edge counter 67 will show four edges, i.e, existence of glitch, leading the user to further investigation.

As in the foregoing, the glitch detection unit of the present invention allows the test system to detect unexpected output transitions in the device under test while adding only a small amount of extra hardware to the test system. The glitch detection unit also enhances failure detection accuracy without requiring extensive test pattern generation or increasing a device test time.

The second embodiment of the present invention is shown in the timing charts of FIGS. 10A–10C and FIGS. 11A–11C to detect glitches. The first approach is to use many strobes within a cycle of the device output as shown in FIGS. 10A–10C. In this example, FIG. 10A shows an expected (simulated) output signal, FIG. 10B shows an actual output signal of the device under test having a glitch therein, and FIG. 10C shows an example of timings in the multiple strobe signals in accordance with the present invention. The user can specify the timings and resolution (time difference between two adjacent strobes) of the strobes when setting the test conditions.

Figure 11A:
FIGS. 11A–11C are timing charts showing a relationship among an expected output signal, an actual output signal of the device under test having a glitch therein, and timings of the continuous strobe signal in the present invention.
Figure 11B:
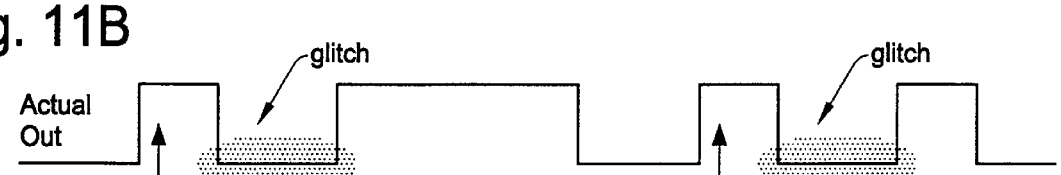
Figure 11C:
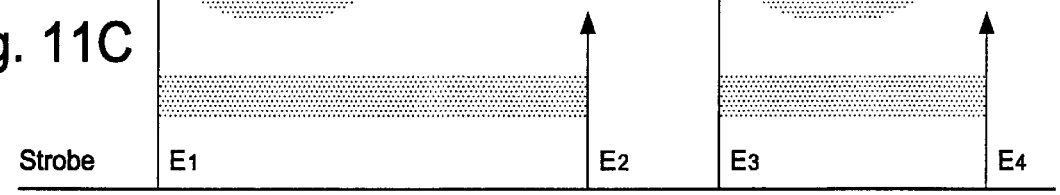

The second approach is to use continuous strobes within a cycle of the device output as shown in FIGS. 11A–11C. In this example, FIG. 11A shows an expected (simulated) output signal, FIG. 11B shows an actual output signal of the device under test having a glitch therein, and FIG. 10C shows an example of continuous strobe in accordance with the present invention. The continuous strobe is generated by continuously increasing a time difference from a previous strobe point by so programming the event timing data in the event memory or by the operation of the event generator. The user can specify an area within a cycle of the device output signal for continuously strobing the output signal. The continuous strobe may be activated for a specified time length such as between E1 and E2 or between E3 and E4 of FIG. 11C.

In the second embodiment, glitches can be accurately detected by the multiple-strobe signals or the continuous strobe signals of the present invention. The second embodiment of the present invention is effective in detecting glitches in the output signal of the device under test without adding any hardware to the test system.

According to the present invention, the glitch detection unit in the first embodiment allows the test system to detect unexpected output transitions in the device under test while adding only a small amount of extra hardware to the test system. The glitch detection unit also enhances failure detection accuracy without requiring extensive test pattern generation or increasing a device test time. In the second embodiment, glitches can be accurately detected by the multiple-strobe signals or the continuous strobe signals of the present invention. The second embodiment of the present invention is effective in detecting glitches in the output signal of the device under test without adding any hardware to the test system.

Although only a preferred embodiment is specifically illustrated and described herein, it will be appreciated that many modifications and variations of the present invention are possible in light of the above teachings and within the purview of the appended claims without departing the spirit and intended scope of the invention.

What is claimed is:

1. A semiconductor test system for testing a semiconductor device, comprising:

an event memory for storing event data regarding events in intended signals to be generated for testing a semiconductor device under test (DUT);

an event generator for producing the intended signals which are test patterns, strobe signals and expected patterns based on the event data from the event memory;

a pin electronics provided between the event generator and the DUT for transmitting the test pattern from the event generator to the DUT and receiving an output signal of the DUT and sampling the output signal by timings of the strobe signals from the event generator;

a pattern comparator for comparing sampled output data from the pin electronics with the expected patterns and producing a failure signal when there is a mismatch therebetween; and a glitch detection unit for receiving the output signal from the DUT and detecting a glitch in the output signal by counting a number of edges in the output signal and comparing the number with an expected number of edges.

2. A semiconductor test system as defined in claim 1, wherein the glitch detection unit includes an edge count unit for counting the number of edges in the output signal from the DUT when the DUT is provided with the test pattern and a logic comparator for comparing the number of edges counted by the edge count unit with the expected number of edges.

3. A semiconductor test system as defined in claim 1, wherein the glitch detection unit includes a first edge count unit for counting the number of edges in the output signal from the DUT when the DUT is provided with the test pattern, a second edge count unit for counting the number of edges in the expected pattern from the event generator, and a logic comparator for comparing the numbers of edges counted by the first edge count unit and the second edge count unit.

4. A semiconductor test system as defined in claim 2, wherein the edge count unit comprising:
   a first analog comparator for detecting changes in the output signal from the DUT by comparing with a high threshold voltage provided thereto;
   a second analog comparator for detecting changes in the output signal from the DUT by comparing with a low threshold voltage provided thereto;
   a first edge counter for counting the number of rising edges from the first analog comparator;
   a second edge counter for counting the number of falling edges from the second analog comparator; and
   a multiplexer for selecting the count data from the first edge counter or from the second edge counter to provide the count data to the logic comparator.

5. A semiconductor test system as defined in claim 3, wherein each of the first and second the edge count units comprising:
   a first analog comparator for detecting changes in the output signal from the DUT by comparing with a high threshold voltage provided thereto;
   a second analog comparator for detecting changes in the output signal from the DUT by comparing with a low threshold voltage provided thereto;
   a first edge counter for counting the number of rising edges from the first analog comparator;
   a second edge counter for counting the number of rising edges from the second analog comparator; and
   a multiplexer for selecting the count data from the first edge counter or from the second edge counter to provide the count data to the logic comparator.

6. A semiconductor test system for testing a semiconductor device, comprising:
   an event memory for storing event data regarding events in intended signals to be generated for testing a semiconductor device under test (DUT);
   an event generator for producing the intended signals which are test patterns, strobe signals and expected patterns based on the event data from the event memory;
   a pin electronics unit provided between the event generator and the DUT for transmitting the test pattern from the event generator to the DUT and receiving an output signal of the DUT and sampling the output signal by timings of the strobe signals from the event generator; and
   a pattern comparator for comparing sampled output data from the pin electronics unit with the expected patterns and producing a failure signal when there is a mismatch therebetween;
   wherein a plurality of strobe signals are provided to the pin electronics unit with a specified time interval small enough to detect a glitch in the output signal when the test pattern is provided to the DUT.

7. A semiconductor test system as defined in claim 6, wherein the strobe signals are a strobe signal which continuously changes strobe points within a specified time length in the output signal from the DUT.

8. A semiconductor test system for testing a semiconductor device, comprising:
   a pattern generator for generating test patterns, strobe signals, and expected patterns for testing a semiconductor device under test (DUT);
   a timing generator for determining timings of the test patterns, expected patterns and strobe signals;
   a wave formatter for producing waveforms of the test pattern to be supplied to the DUT;
   a pin electronics unit provided between the wave formatter and the DUT for transmitting the test pattern from the wave formatter to the DUT and receiving an output signal of the DUT and sampling the output signal by timings of the strobe signals from the pattern generator;
   a pattern comparator for comparing the sampled output data from the pin electronics unit with the expected pattern and producing a failure signal when there is a mismatch therebetween; and
   a glitch detection unit for receiving the output signal from the DUT and detecting a glitch in the output signal by counting a number of edges in the output signal and comparing the number with an expected number of edges.

9. A semiconductor test system as defined in claim 8, wherein the glitch detection unit includes an edge count unit for counting the number of edges in the output signal from the DUT when the DUT is provided with the test pattern, and a logic comparator for comparing the number of edges counted by the edge count unit with the expected number of edges.

10. A semiconductor test system as defined in claim 8, wherein the glitch detection unit includes a first edge count unit for counting the number of edges in the output signal from the DUT when the DUT is provided with the test pattern, a second edge count unit for counting the number of edges in the expected pattern from the pattern generator, and a logic comparator for comparing the numbers of edges counted by the first edge count unit and the second edge count unit.

11. A semiconductor test system as defined in claim 9, wherein the edge count unit comprising:
   a first analog comparator for detecting changes in the output signal from the DUT by comparing with a high threshold voltage provided thereto;
   a second analog comparator for detecting changes in the output signal from the DUT by comparing with a low threshold voltage provided thereto;
   a first edge counter for counting the number of rising edges from the first analog comparator;
   a second edge counter for counting the number of falling edges from the second analog comparator; and
   a multiplexer for selecting count data from the first edge counter or from the second edge counter to provide the count data to the logic comparator.

12. A semiconductor test system as defined in claim 10, wherein each of the first and second the edge count units comprising:
   a first analog comparator for detecting changes in the output signal from the DUT by comparing with a high threshold voltage provided thereto;
   a second analog comparator for detecting changes in the output signal from the DUT by comparing with a low threshold voltage provided thereto;
   a first edge counter for counting the number of rising edges from the first analog comparator;
   a second edge counter for counting the number of falling edges from the second analog comparator; and
   a multiplexer for selecting count data from the first edge counter or from the second edge counter to provide the count data to the logic comparator.

* * * * *